United States Patent
Venkatesan et al.

(10) Patent No.: US 10,797,713 B1
(45) Date of Patent: Oct. 6, 2020

(54) HIGH-SPEED HIGH-RESOLUTION DIGITALLY-CONTROLLED OSCILLATOR AND METHOD THEREOF

(71) Applicant: Realtek Semiconductor Corp., Hsinchu (TW)

(72) Inventors: Sriram Venkatesan, Fremont, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/537,704

(22) Filed: Aug. 12, 2019

(51) Int. Cl.
*H03L 7/099* (2006.01)
*H03L 7/189* (2006.01)
*H03K 3/03* (2006.01)

(52) U.S. Cl.
CPC ......... *H03L 7/0995* (2013.01); *H03K 3/0322* (2013.01); *H03L 7/189* (2013.01)

(58) Field of Classification Search
CPC ...... H03K 3/03; H03K 3/0315; H03K 3/0322; H03L 7/0995; H03L 7/189
See application file for complete search history.

(56) References Cited

U.S. PATENT DOCUMENTS 7,429,895 B2 * 9/2008 Easwaran ............... H03L 7/189
331/16

2011/0068841 A1 3/2011 Huang et al.
2012/0098604 A1 * 4/2012 Lee ..................... H03K 3/011
331/57

OTHER PUBLICATIONS

Han, Te, et al. "A noise-insensitive high-resolution digitally controlled ring oscillator with multipoint-tuning technique." 2012 IEEE 11th International Conference on Solid-State and Integrated Circuit Technology. IEEE, 2012. (Year: 2012).*
TW Office Action dated Jun. 2, 2020 in Taiwan application (No. 108146368).
Search Report issued in TW Office Action dated Jun. 2, 2020 in Taiwan application (No. 108146368).

* cited by examiner

*Primary Examiner* — Ryan Johnson
(74) *Attorney, Agent, or Firm* — McClure, Qualey & Rodack, LLP

(57) ABSTRACT

A method comprises: using a plurality of gain stages cascaded in a ring topology to form a ring oscillator configured to output an oscillation signal; controlling a supply voltage of said ring oscillator using a low-speed DAC (digital-to-analog converter) in accordance with a coarse control word; providing a capacitive load at an inter-stage node of said ring oscillator using a varactor array controlled by a control voltage array; establishing said control voltage array using a high-speed DAC array in accordance with a fine control word; adjusting the coarse control word upon a start-up to make an oscillation frequency of said oscillation signal approximately equal to target value; and adjusting the fine control word in a closed loop manner in accordance with a detection of a timing error of said oscillation signal.

18 Claims, 7 Drawing Sheets

HIGH-SPEED HIGH-RESOLUTION DIGITALLY-CONTROLLED OSCILLATOR AND METHOD THEREOF

BACKGROUND OF THE DISCLOSURE

Field of the Disclosure

The present disclosure generally relates to digitally-controlled oscillators, and more particularly to high-speed and high-resolution digitally-controlled oscillators.

Description of Related Art

A digitally-controlled oscillator (DCO) outputs an oscillation signal of an oscillation frequency in accordance with a control word such that the oscillation frequency is determined by the control word. When the control word changes, the oscillation frequency changes accordingly. A speed of a DCO is gauged by a delay time between a change of the control word and a corresponding change of the oscillation frequency: the shorter delay time, the higher speed. A resolution of a DCO is determined by an amount of an incremental change of the oscillation frequency in response to an incremental change of the control word: the smaller incremental change, the higher resolution. A DCO is usually incorporated in a closed loop, wherein the control word is determined in a feedback manner to make a timing of the oscillation signal tracks a reference timing. The closed loop can be a phase lock loop, or a clock-data recovery loop. A higher-speed DCO allows the closed loop to track the reference timing faster. A higher-resolution DCO allows the timing of the oscillation signal to track the reference timing more precisely. In general, a high-speed high-resolution DCO is desirable.

A DCO comprises a core circuit and a tuning network. The core circuit is an active circuit that can sustain an oscillation condition, while the tuning network can tune an oscillation frequency. Ring oscillator is a popular topology for embodying the core circuit because it is compact in a physical layout. When embodied by a monolithic integrated circuit fabricated using a CMOS (complementary metal oxide semiconductor) process, a DCO is subject to PVT (process, voltage, and temperature) variation, and consequently an oscillation frequency of the DCO can have an appreciable spread under PVT variation. The problem of the spread due to PVT variation is usually quite serious if the DCO is based on a ring-oscillator topology. On the other hand, a high-resolution DCO requires a frequency-tuning network of a fine granularity. Therefore, the frequency-tuning network not only needs to have a large tuning range to cover a large spread of the oscillation frequency of the DCO due to the PVT variation, but also needs to have a fine granularity. This usually leads to a requirement of a highly complex tuning network. A highly complex tuning network, however, is usually not amenable to a high speed, as a more complex network is generally slower. In addition, a high-speed circuit tends to be noisier. Therefore, a high-speed high-resolution ring-oscillator based DCO is generally difficult to design, as well as to meet a low-noise requirement.

What is to be desired is a ring-oscillator based DCO that have a high speed and a high resolution.

BRIEF DESCRIPTION OF THIS DISCLOSURE

In an embodiment, a DCO (digitally-controlled oscillator) comprises: a ring oscillator comprising a plurality of gain stages cascaded in a ring topology with a negative feedback to output an oscillation signal at an inter-stage node in accordance with a supply voltage at a supply node; a low-speed DAC (digital-to-analog converter) configured to output a supply current to the supply node to establish the supply voltage in accordance with a coarse control word; a varactor array configured to provide a capacitive load to said inter-stage node in accordance with a control voltage array; and a high-speed DAC array configured to output said control voltage array in accordance with a fine control word.

In an embodiment, a method comprises: using a plurality of gain stages cascaded in a ring topology to form a ring oscillator configured to output an oscillation signal; controlling a supply voltage of said ring oscillator using a low-speed DAC (digital-to-analog converter) in accordance with a coarse control word; providing a capacitive load at an inter-stage node of said ring oscillator using a varactor array controlled by a control voltage array; establishing said control voltage array using a high-speed DAC array in accordance with a fine control word; adjusting the coarse control word upon a start-up to make an oscillation frequency of said oscillation signal approximately equal to a target value; and adjusting the fine control word in a closed loop manner in accordance with a detection of a timing error of said oscillation signal.

DETAILED DESCRIPTION OF THIS DISCLOSURE

Figure 1:
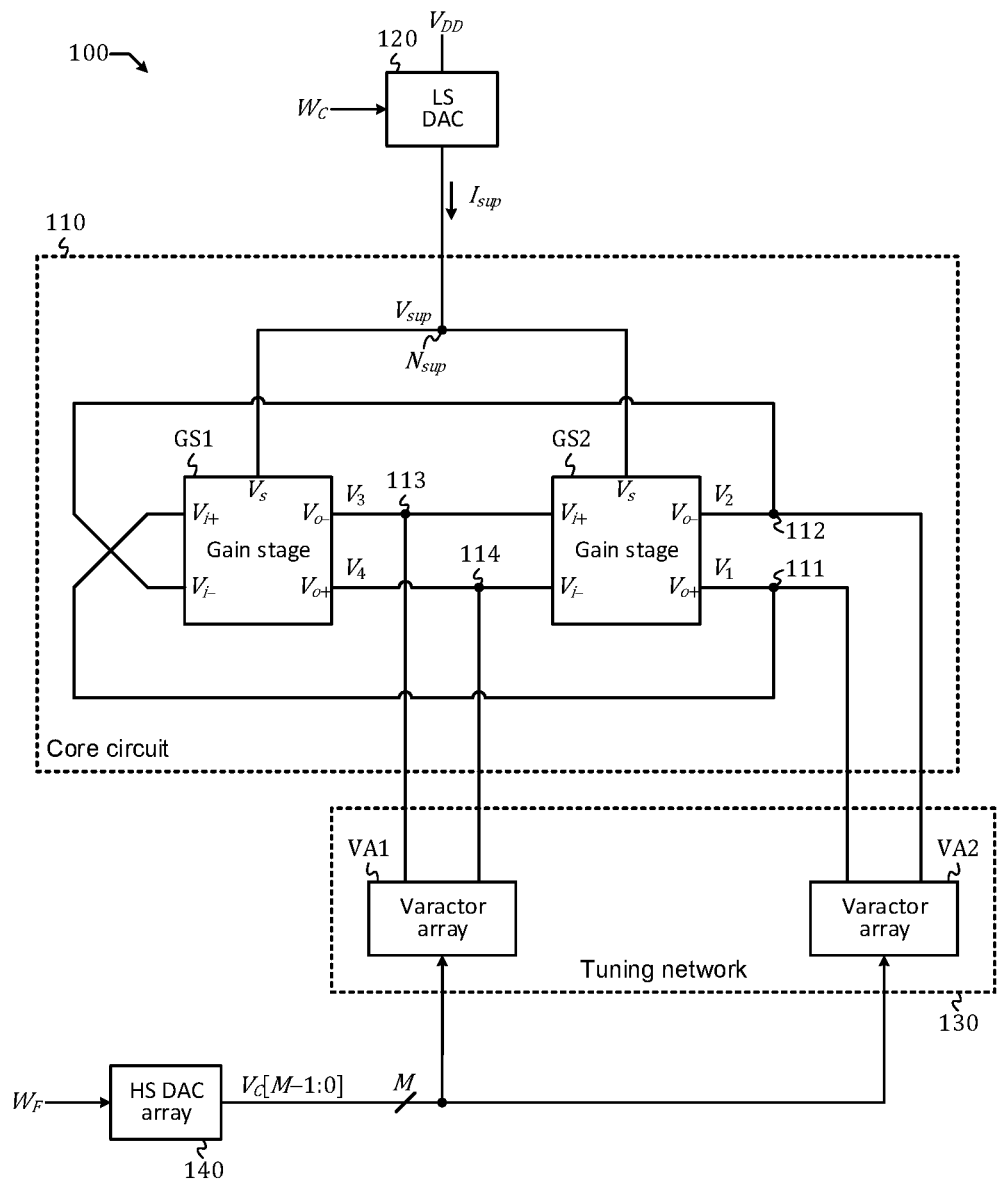
FIG. 1 shows a functional block diagram of a digitally-controlled oscillator in accordance with an embodiment of the present disclosure.

The present disclosure is directed to digitally-controlled oscillator. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "CMOS (complementary metal oxide semiconductor)," "NMOS (N-channel metal oxide semiconductor) transistor," "PMOS (N-channel metal oxide semiconductor) transistor," "resistor," "capacitor," "varactor," "resistance," "capacitance," "current source," "bias," "node," "amplifier," "gain," "common-source," "source follower," "transconductance," "load," "series," "shunt," "clock," "frequency," "ring oscillator," "digital-to-analog converter," "diode-wired," "current mirror," "regenerative load," "differential pair," and "negative feedback." Terms like these are used in a context of microelectronics, and the associated concepts are apparent to those of ordinary skills in the art and thus will not be explained in detail here. Those of ordinary skill in the art can also recognize a symbol of NMOS transistor, and identify the "source," the "gate," and the "drain" terminals thereof.

This present disclosure is disclosed in an engineering sense. For instance, "X is equal to Y" means "a difference between X and Y is smaller than a specified engineering tolerance"; "X is much smaller than Y" means "X divided by Y is smaller than an engineering tolerance"; and "X is zero" means "X is smaller than a specified engineering tolerance."

In this disclosure, a signal is either a voltage or a current that represents a certain information.

A logical signal is a signal of two states: a high state and a low state. Here, a logical signal is said to be in the high (low) state when a level of said logical signal is above (below) a certain trip point pertaining to said logical signal. The statement that "(the logical signal) X is high," means that, in a context of logical signal: "(the logical signal) X is in the high state."

A "clock" is a logical signal that cyclically toggles between a high state and a low state.

Throughout this disclosure, "$V_{DD}$" denotes a power supply node. For convenience, "$V_{DD}$" can also refer to a power supply voltage provided at the power supply node. That is, "$V_{DD}$ is 0.9V" means "a power supply voltage at the power supply node $V_{DD}$ is 0.9V." Since a circuit can have a plurality of power supply nodes, which may or may not be of the same voltage, a numeric suffix is appended for differentiation purpose. For instance, "$V_{DD1}$" denotes a first power supply node, "$V_{DD2}$" denotes a second power supply node, and "$V_{DD3}$" denotes a third power supply node. Note that although "$V_{DD1}$," "$V_{DD2}$," and "$V_{DD3}$" may be of different voltages, but they may not be necessarily be of different voltages.

A schematic diagram of a DCO (digitally-controlled oscillator) 100 in accordance with an embodiment of the present disclosure is shown in FIG. 1. DCO 100 comprises: a core circuit 110 comprising a plurality of gain stages cascaded in a ring topology with negative feedback to sustain an oscillation in accordance with a supply voltage $V_{sup}$ at a supply node $N_{sup}$; a LS (low-speed) DAC (digital-to-analog converter) 120 configured to output a supply current $I_{sup}$ to the supply node $N_{SUP}$ to establish the supply voltage $V_{sup}$ in accordance with a coarse control word $W_C$; a tuning network 130 comprising a plurality of varactor arrays configured to provide a capacitive load to the core circuit 110 in accordance with an M-dimensional control voltage array $V_C[M-1:0]$, wherein M is an integer greater than 1; and a HS (high-speed) DAC array 140 configured to output said M-dimensional control voltage array $V_C[M-1:0]$ in accordance with a fine control word $W_F$. Here, a bus notation is used for $V_C[M-1:0]$ to represent a collection of $V_C[0]$, $V_C[1]$, $V_C[2]$, ..., $V_C[M-1]$.

By way of example but not limitation, the cores circuit 110 comprises two gain stages including a first gain stage GS1 and a second gain stage GS2, and the tuning network 130 comprises two varactor arrays including a first varactor array VA1 and a second varactor array VA2. The first gain stage GS1 receives a first pair of oscillating voltages $V_1$ and $V_2$ at a first pair of inter-stage nodes 111 and 112, respectively, and output a second pair of oscillating voltages $V_3$ and $V_4$ at a second pair of inter-stage nodes 113 and 114, respectively. The second gain stage GS2 receives the second pair of oscillating voltages $V_3$ and $V_4$ at the second pair of inter-stage nodes 113 and 114, respectively and outputs the first pair of oscillating voltages $V_1$ and $V_2$ at the first pair of inter-stage nodes 111 and 112, respectively. The first varactor array VA1 provides a capacitive load across the second pair of inter-stage nodes 113 and 114. The second varactor array VA2 provides a capacitive load across the first pair of inter-stage nodes 111 and 112. A plurality of gain stages cascaded in a ring topology with a negative feedback, such as gain stages GS1 and GS2 in core circuit 110, form a ring oscillator and can sustain an oscillation; this is well known in the prior art and thus not explained in detail here.

In DCO 100, $V_1$, $V_2$, $V_3$, and $V_4$ are all oscillating voltages of an oscillation frequency. Any of $V_1$, $V_2$, $V_3$, and $V_4$ can be said to be an oscillation signal of DCO 100.

Gain stages GS1 and GS2 are instantiated from the same building block; each has a first input pin "$V_{i+}$," a second input pin "$V_{i-}$," a first output pin "$V_{o+}$," a second output pin "$V_{o-}$," and a source pin "$V_s$." Gain stage GS1 receives $V_{SUP}$, $V_1$, and $V_2$, via its "$V_s$," "$V_{i+}$," and "$V_{i-}$" pins, respectively, and output $V_3$, and $V_4$ via its "$V_{o-}$" and "$V_{o+}$" pins, respectively. Gain stage GS2 receives $V_{SUP}$, $V_3$, and $V_4$ via its "$V_s$," "$V_{i+}$," and "$V_{i-}$" pins, respectively, and output $V_1$ and $V_2$ via its "$V_{o+}$," and "$V_{o-}$" pins, respectively.

Figure 2:
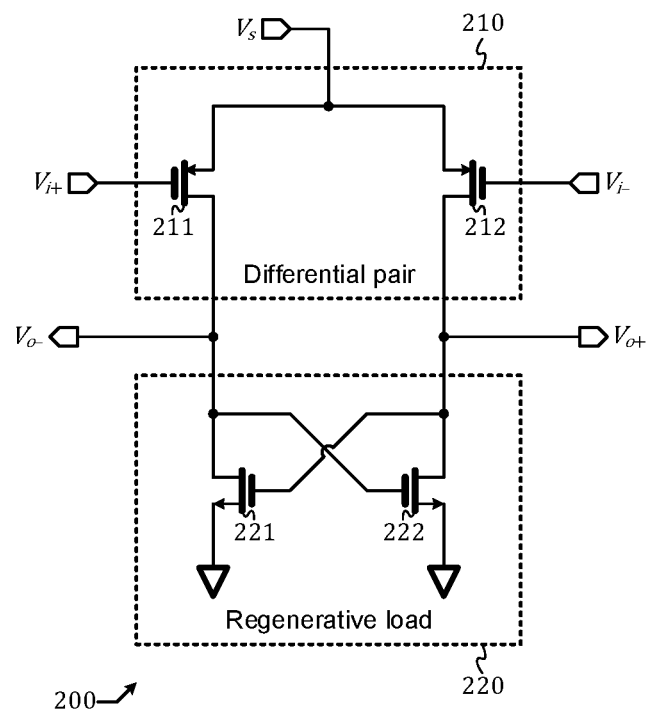
FIG. 2 shows a schematic diagram of an exemplary embodiment of a gain stage.

A schematic diagram of an exemplary gain stage 200 that can be instantiated to embody gains stages GS1 and GS2 is shown in FIG. 2. Gain stage 200 comprises: a differential pair 210 comprising a pair of PMOS (p-channel metal oxide semiconductor) transistors 211 and 212 configured to receive inputs from pins "$V_{i+}$" and "$V_{i-}$," and output outputs to pins "$V_{o-}$" and "$V_{o+}$," respectively in accordance with a biasing condition established via pin "$V_s$"; and a regenerative load 220 comprising a pair of NMOS transistors 221 and 222 configured in a cross-coupling topology. The regenerative load 220 is used to establish a load of negative resistance and consequently a "right-half-plane pole," which can initiate an oscillation (for the core circuit 110 where the gain stage 200 is instantiated), while the differential pair 210 is used to provide a gain and thus sustain the oscillation. Inter-connection in FIG. 2 such as "the source, the gate, and the drain of PMOS transistor 211 connect to pins $V_s$, $v_{i+}$, and $V_{o-}$, respectively" is self-explanatory to those of ordinary skill in the art and thus not described in detail here. A delay of gain stage 200 is determined by a transconductance of the differential pair 210 and a load capacitance across pins "$V_{o-}$" and "$V_{o+}$": the higher transconductance of the differential pair 210, the faster the capacitive load across pins "$V_{o-}$" and "$V_{o+}$" can be charged/discharged, and thus a smaller delay; on the other hand, the larger load capacitance across pins "$V_{o-}$" and "$V_{o+}$," the slower the capacitive load can be charged/discharged, and thus a larger delay.

As shown in FIG. 1, an oscillation frequency of the core circuit 110 is determined by a delay of gain stages GS1 and GS2. A delay of gain stage GS1 (GS2) is determined by a transconductance thereof and a capacitance across inter-stage nodes 113 (111) and 114 (112). The transconductance of gain stages GS1 (GS2) is adjusted by the supply current $I_{sup}$ supplied from LS DAC 120 to the supply node $N_{SUP}$ in accordance with the coarse control word $W_C$, while the load capacitance across inter-stage nodes 113 (111) and 114 (112) is adjusted by a capacitance of varactor array VA1 (VA2) controlled by $V_C[M-1:0]$ that is determined by the fine control word $W_F$. A larger (smaller) supply current $I_{sup}$, and incidentally a higher (lower) supply voltage $V_{sup}$, leads to a larger (smaller) transconductance for gain stages GS1 and GS2 and consequently a higher (lower) oscillation frequency. Upon a start-up, the transconductance is adjusted by adjusting the coarse control word $W_C$ to make the oscillation frequency close to a target value; this effectively eliminates the impact of a variation of process and voltage on the oscillation frequency. Then, the coarse control word $W_C$ is frozen and the load capacitance is adjusted by the fine control word $W_F$ in a closed-loop manner, e.g. in a phase lock loop or clock-data recovery loop, so that a timing of the oscillation signal tracks a timing of a reference signal. The adjustment of the transconductance occurs at the start-up and is not subject to a high-speed requirement. However, it is highly desirable to suppress a noise in the supply current $I_{sup}$, otherwise the delay of gain stages GS1 and GS2 may be subject to an appreciable variation caused by the noise. Due to low-speed nature, LS DAC 120 can apply low-pass filtering technique (which slows down the circuit but that is acceptable in this occasion) to suppress a noise in the supply current $I_{suo}$. On the other hand, the adjustment of the load capacitance is undertaken in a closed-loop manner and is subject to a high-speed requirement. HS DAC array 140 is designed in a way that $V_C[M-1:0]$ can be adapted in a speedy manner, and so can said varactor array VA1 and VA2.

Figure 3:
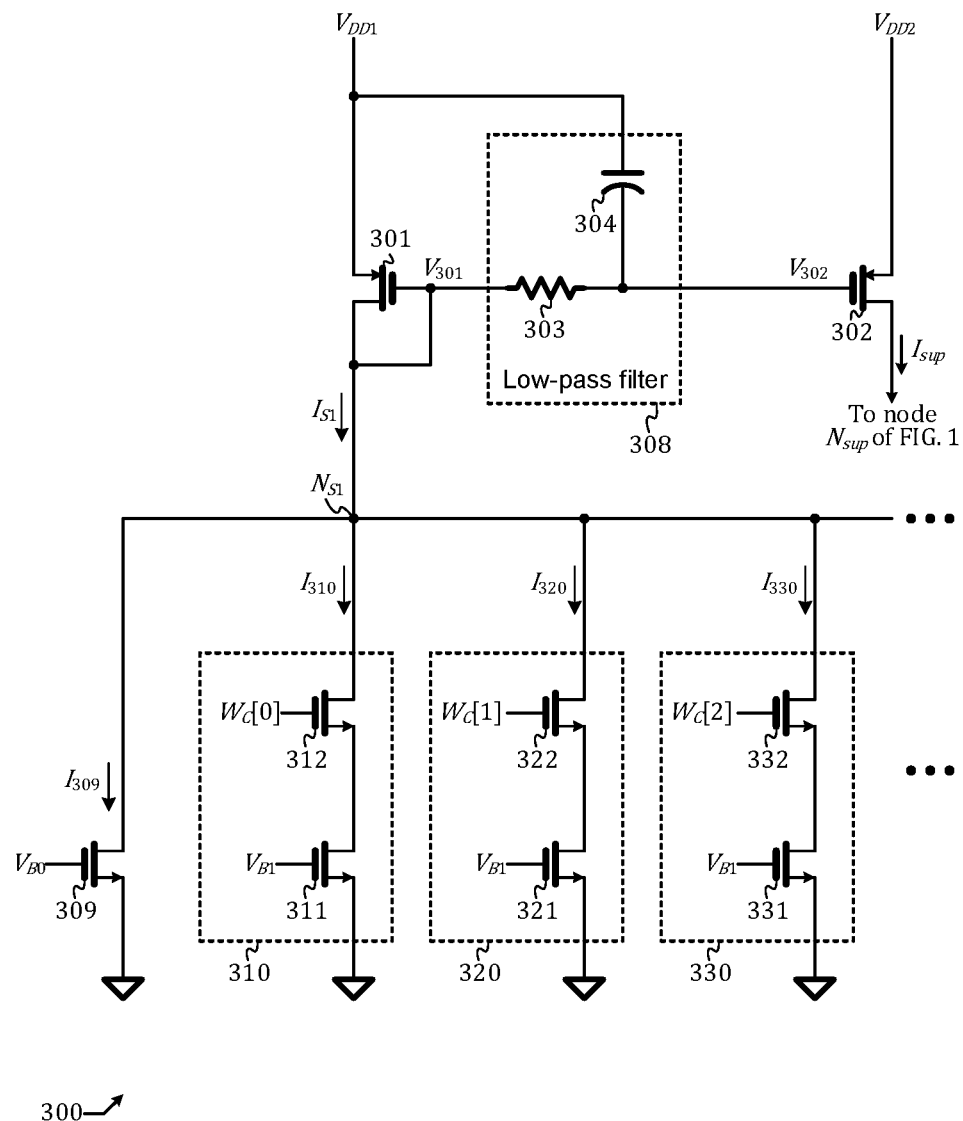
FIG. 3 shows a schematic diagram of an exemplary embodiment of a low-speed digital-to-analog converter.

A schematic diagram of a DAC 300 that can be used to embody LS DAC 120 is shown in FIG. 3. DAC 300 comprises: a current source embodied by a NMOS transistor 309 configured to output a fixed current $I_{309}$ to a summing node $N_{S1}$ in accordance with a gate-biasing voltage $V_{B0}$; a plurality of switch-current cells 310, 320, 330, and so on, configured to output a plurality of programmable currents $I_{310}$, $I_{320}$, and $I_{330}$, and so on to the summing node $N_{S1}$, in accordance with a control by $W_C[0]$, $W_C[1]$, $W_C[2]$, and so on, respectively; a first PMOS (p-channel metal oxide semiconductor) transistor 301 configured in a diode-wired topology to convert a summed current $I_{S1}$ received from the summing node $N_{S1}$ into a bias voltage $V_{301}$; a low-pass filter 308 comprising a series resistor 303 and a shunt capacitor 304 configured to filter the bias voltage $V_{301}$ into a filtered bias voltage $V_{302}$; and a second PMOS transistor 302 configured to output the supply current $I_{sup}$ to node $N_{sup}$ of FIG. 1 in accordance with the filtered bias voltage $V_{302}$. Switch-current cell 310 (320, 330) comprises a current source embodied by NMOS transistor 311 (321, 331) controlled by another gate-biasing voltage $V_{B1}$ and a switch embodied by NMOS transistor 312 (322, 332) controlled by $W_C[0]$ ($W_C[1]$, $W_C[2]$). When $W_C[0]$ ($W_C[1]$, $W_C[2]$) is high, switch-current cell 310 (320, 330) is in an "on" state and $I_{310}$ ($I_{320}$, $I_{330}$) is established in accordance with the gate-biasing voltage $V_{B1}$. When $W_C[0]$ ($W_C[1]$, $W_C[2]$) is low, switch-current cell 310 (320, 330) is in an "off" state and $I_{310}$ ($I_{320}$, $I_{330}$) is zero. $W_C[0]$, $W_C[1]$, $W_C[2]$, and so on, are all logical signals that collectively form the coarse control word $W_C$, therefore, the summed current $I_{S1}$ is controlled by $W_C$. In an embodiment wherein "$V_{DD1}$" and "$V_{DD2}$" are shorted and thus are of the same voltage, PMOS transistors 301 and 302 form a "current mirror," so that the supply current $I_{sup}$ is scaled from $I_{S1}$ in accordance with a factor determined by a ratio between a W/L (width-to-length ratio) of PMOS transistor 302 and a W/L of PMOS transistor 301. The low pass filter 308 helps to make $V_{302}$ clean, and thus make $I_{sup}$ clean. DAC 300, except for the low pass filter 308, is a typical current-mode DAC circuit that is self-explanatory to those of ordinary skills in the art and thus not explained in detail here.

Note that the diode-wired PMOS transistor 301 is an example of a "current-to-voltage converter," as it converts the current $I_{S1}$ into the voltage $V_{301}$ using the diode-wired PMOS transistor 301 as a load. In an alternative embodiment not shown in figure, the diode-wired PMOS transistor 301 is replaced by a resistor, which can also be used as a load.

PMOS transistor 302 is configured in a "common-source amplifier" topology, wherein a higher (lower) $V_{302}$ leads to a smaller (larger) $I_{sup}$. In an alternative embodiment not shown in figure, PMOS transistor 302 is replaced with a NMOS transistor configured in a "source follower" topology. In this alternative embodiment, the supply current $I_{sup}$ increases (decreases) when the filtered bias voltage $V_{302}$ rises (falls), and therefore a logical inversion on $W_C[0]$, $W_C[1]$, $W_C[2]$, and so on is needed, otherwise a direction of a change in $I_{sup}$ in response to a change of $W_C$ will be opposite. The NMOS transistor based alternative embodiment can be used to filter Supply noise ($V_{DD1}$) and provide a cleaner power $V_{DD2}$ to the GS1/GS2 stages.

Generally, a semiconductor circuit slows down as a temperature rises. There is no exception to DCO 100. To compensate a slow-down of the oscillation due to a temperature rise, a higher supply current $I_{sup}$ is needed when the temperature rises. In an embodiment, gate-biasing voltages $V_{B0}$ and $V_{B1}$ are established using a PTAT (proportional to absolute temperature) voltage generator, so that currents $I_{309}$ and $I_{310}$, $I_{311}$, $I_{312}$, and so on, and consequently $I_{S1}$ and $I_{sup}$ can rise when the temperature rises. This can effectively reduce an amount of drift in the oscillation frequency of DCO 100 due to a temperature drift. PTAT voltage generator is well known in the prior art and thus not described in detail here.

Figure 4:
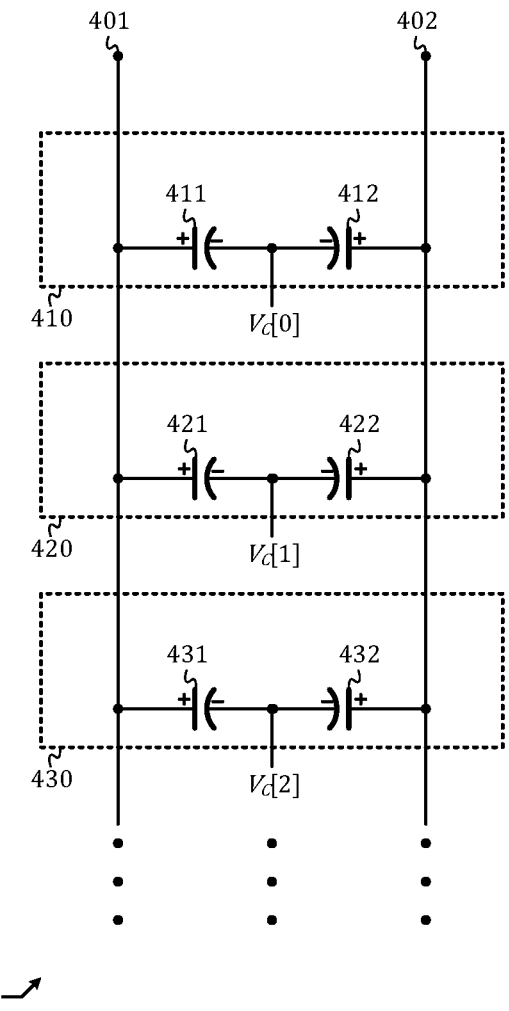
FIG. 4 shows a schematic diagram of a varactor array.

A schematic diagram of a varactor array 400 that can be instantiated to embody varactor array VA1 and VA2 is shown in FIG. 4. Varactor array 400 comprises: a plurality of varactor pairs including a first varactor pair 410, a second varactor pair 420, a third varactor pair 430, and so on, controlled by $V_C[0]$, $V_C[1]$, $V_C[2]$, and so on, respectively, configured in a parallel connection topology to embody a tunable capacitor across two nodes 401 and 402. When instantiated to embody VA1 (VA2), the two nodes 401 and 402 refer to nodes 113 (111) and 114 (112). Here, $V_C[0]$, $V_C[1]$, $V_C[2]$, and so on are control voltages that collectively form $V_C[M-1:0]$. Varactor pair 410 (420, 430) comprises: a first varactor 411 (421, 431) with a positive end, denoted by "+," connected to node 401 and a negative end, denoted by "−," connected to $V_C[0]$ ($V_C[1]$, $V_C[2]$); and a second varactor 412 (422, 432) with a positive end, denoted by "+," connected to node 402 and a negative end, denoted by "−," connected to $V_C[0]$ ($V_C[1]$, $V_C[2]$). A varactor is a capacitor of a capacitance determined by a voltage difference between its positive end and negative end. As control voltage $V_C[0]$ ($V_C[1]$, $V_C[2]$) rises (falls), a capacitance of varactor 411 (421, 431) and a capacitance of varactor 412 (422, 432) both decrease (increase), a total capacitance of varactor pair 410 (420, 430) across nodes 401 and 402 decreases (increases); consequently, a total capacitance of the varactor array 400 decreases (increases), and an oscillation frequency of the core circuit 110 rises (falls).

Figure 5:
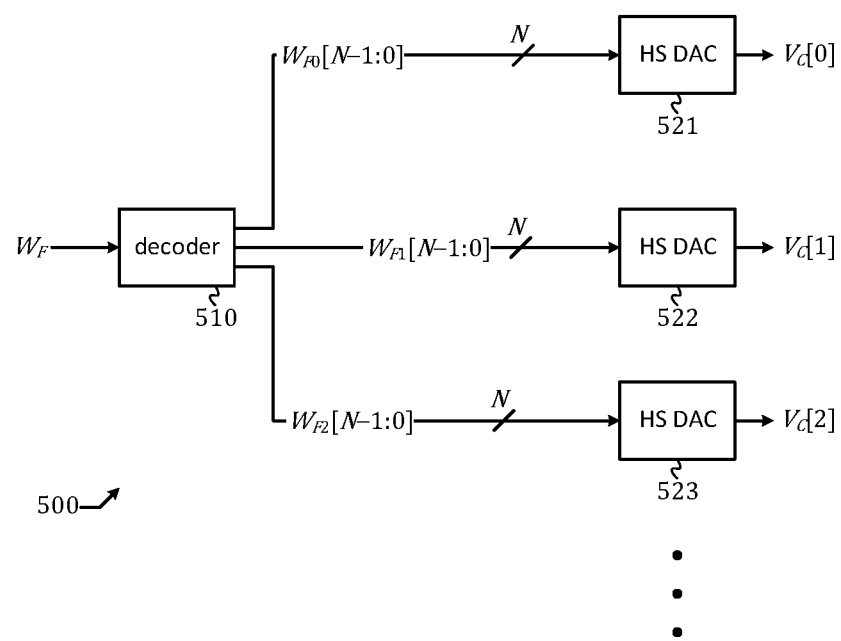
FIG. 5 shows a functional block diagram of an exemplary embodiment of a high-speed digital-to-analog converter array.

A functional block diagram of a DAC array 500 that can be used to embody HS DAC array 140 is shown in FIG. 5. HS DAC array 500 comprises: a decoder 510 configured to receive the fine control word $W_F$ and output a plurality of decoded words $W_{F0}$, $W_{F1}$, $W_{F2}$, and so on; and a plurality of HS (high-speed) DAC 521, 522, 523, and so on, configured to output $V_C[0]$, $V_C[1]$, $V_C[2]$, and so on in accordance with decoded words $W_{F0}$, $W_{F1}$, $W_{F2}$ and so on, respectively. Here, $W_{F0}$, $W_{F1}$, and $W_{F2}$ are all N-bit words, where N is an integer greater than 1, and expressed by $W_{F0}[N-1:0]$, $W_{F1}$

[N−1:0], and $W_{F2}[N-1:0]$, respectively, in a bus notation. Decoder 510 decodes $W_F$ into a sum of $W_{F0}$, $W_{F1}$, $W_{F2}$, and so on, that is:

$$W_F = W_{F0} + W_{F1} + W_{F2} + \ldots \equiv \Sigma_i W_{Fi} \quad (1)$$

In a first embodiment, a thermometer code is used so that values of $W_{F0}$, $W_{F1}$, $W_{F2}$ and so on are all between 0 and N and are determined by the following equation:

$$W_{Fi} = \begin{cases} 0 & \text{if } W_F < iN \\ \mod(W_F, N) & \text{if } iN \leq W_F < (i+1)N \\ N & \text{if } W_F \geq (i+1)N \end{cases} \quad (2)$$

for i=0, 1, 2, and so on, and $W_{Fi}$ is represented in a bus notation by $W_{Fi}[N-1:0]$ in accordance with the following equation:

$$W_{Fi}[j] = \begin{cases} 0 & \text{if } W_{Fi} \leq j \\ 1 & \text{if } W_{Fi} > j \end{cases} \quad (3)$$

for j=0, 1, 2, ..., N−1. Here, mod(•) denotes a modulo operation. For instance, mod(5,2) means "5 mod 2" and is equal to 1.

By way of example, in a case where N is 4, a table in accordance with equations (2) and (3) is shown below:

| $W_F$ | $W_{F2}$ | $W_{F2}[1:0]$ | $W_{F1}$ | $W_{F1}[1:0]$ | $W_{F0}$ | $W_{F0}[1:0]$ |
|---|---|---|---|---|---|---|
| 0 | 0 | 00 | 0 | 00 | 0 | 0000 |
| 1 | 0 | 0000 | 0 | 0000 | 1 | 0001 |
| 2 | 0 | 0000 | 0 | 0000 | 2 | 0011 |
| 3 | 0 | 0000 | 0 | 0000 | 3 | 0111 |
| 4 | 0 | 0000 | 0 | 0000 | 4 | 1111 |
| 5 | 0 | 0000 | 1 | 0001 | 4 | 1111 |
| 6 | 0 | 0000 | 2 | 0011 | 4 | 1111 |
| 7 | 0 | 0000 | 3 | 0111 | 4 | 1111 |
| 8 | 0 | 0000 | 4 | 1111 | 4 | 1111 |
| 9 | 1 | 0001 | 4 | 1111 | 4 | 1111 |
| 10 | 2 | 0011 | 4 | 1111 | 4 | 1111 |
| 11 | 3 | 0111 | 4 | 1111 | 4 | 1111 |
| 12 | 4 | 1111 | 4 | 1111 | 4 | 1111 |

In an alternative embodiment, a binary code is used so that values of $W_{F0}$, $W_{F1}$, $W_{F2}$ and so on are all between 0 and $2^{N-1}$ and are determined by the following equation:

$$W_{Fi} = \begin{cases} 0 & \text{if } W_F < 2^{i(N-1)} \\ \mod(W_F, 2^{N-1}) & \text{if } 2^{i(N-1)} \leq W_F < 2^{(i+1)(N-1)} \\ 2^{N-1} & \text{if } W_F \geq 2^{(i+1)(N-1)} \end{cases} \quad (4)$$

for i=0, 1, 2, and so on, and $W_{Fi}$ is represented in a bus notation by $W_{Fi}[N-1:0]$ in accordance with a binary representation.

By way of example, for a case where N is 3, a table in accordance with equations (4) along with binary representation is shown below:

| $W_F$ | $W_{F2}$ | $W_{F2}[2:0]$ | $W_{F1}$ | $W_{F1}[2:0]$ | $W_{F0}$ | $W_{F0}[2:0]$ |
|---|---|---|---|---|---|---|
| 0 | 0 | 000 | 0 | 000 | 0 | 000 |
| 1 | 0 | 000 | 0 | 000 | 1 | 001 |
| 2 | 0 | 000 | 0 | 000 | 2 | 010 |
| 3 | 0 | 000 | 0 | 000 | 3 | 011 |
| 4 | 0 | 000 | 0 | 000 | 4 | 100 |
| 5 | 0 | 000 | 1 | 001 | 4 | 100 |
| 6 | 0 | 000 | 2 | 010 | 4 | 100 |
| 7 | 0 | 000 | 3 | 011 | 4 | 100 |
| 8 | 0 | 000 | 4 | 100 | 4 | 100 |
| 9 | 1 | 001 | 4 | 100 | 4 | 100 |
| 10 | 2 | 010 | 4 | 100 | 4 | 100 |
| 11 | 3 | 011 | 4 | 100 | 4 | 100 |
| 12 | 4 | 100 | 4 | 100 | 4 | 100 |

Note that $W_{Fi}[0]$, $W_{Fi}[1]$, $W_{Fi}[2]$) and so on are all logical signals.

Figure 6:
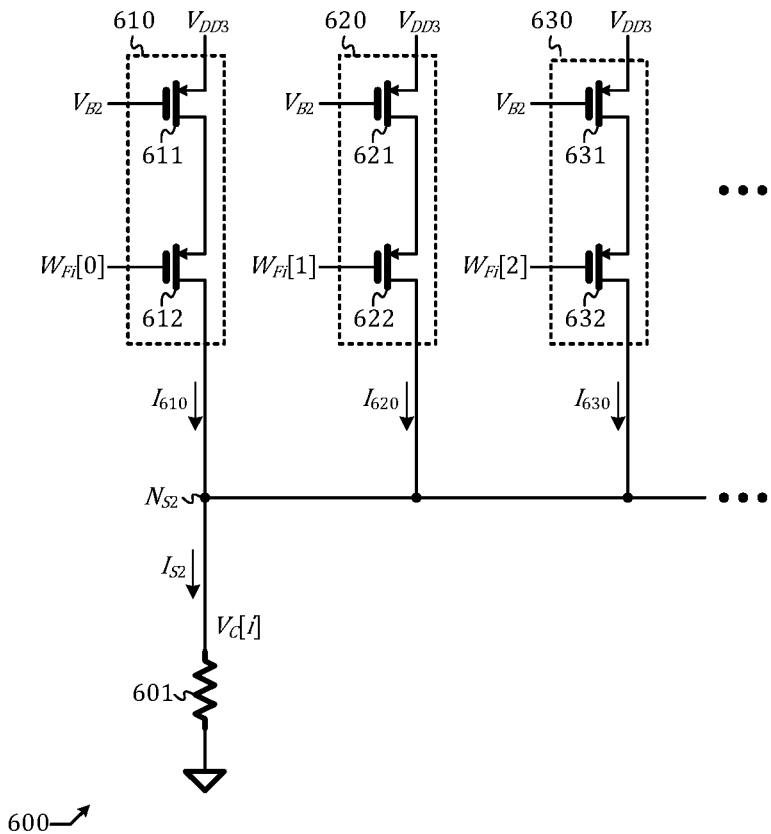
FIG. 6 shows a schematic diagram of an exemplary embodiment of a high-speed digital-to-analog converter.

A schematic diagram of a DAC 600 that can be instantiated to embody HS DAC 521, 522, 523, and so on is shown in FIG. 6. DAC 600 comprise: a plurality of switch-current cells 610, 620, 630, and so on configured to output currents $I_{610}$, $I_{620}$, $I_{630}$, and so on to a summing node $N_{S2}$ in accordance with $W_{Fi}[0]$, $W_{Fi}[1]$, $W_{Fi}[2]$, and so on, respectively, resulting in a summed current $I_{S2}$; and a resistor 601 configured to provide a load to the summing node $N_{S2}$ and convert the summed current $I_{S2}$ into an output voltage $V_C[i]$. When DAC 600 is instantiated to embody HS DAC 521 (522, 523), $V_C[i]$ represents $V_C[0]$ ($V_C[1]$, $V_C[2]$), while $W_{Fi}[0]$ represents $W_{F0}[0]$ ($W_{F1}[0]$, $V_{F2}[0]$), $W_{Fi}[1]$ represents $W_{F0}[1]$ ($W_{F1}[1]$, $V_{F2}[1]$), and $W_{Fi}[2]$ represents $W_{F0}[2]$ ($W_{F1}[2]$, $V_{F2}[2]$). Switch-current cell 610 (620, 630) comprises a current source embodied by PMOS transistor 611 (621, 631) controlled by a gate-biasing voltage $V_{B2}$ and a switch embodied by PMOS transistor 612 (622, 632) controlled by $W_{Fi}[0]$ ($W_{Fi}[1]$, $W_{Fi}[2]$). When $W_{Fi}[0]$ ($W_{Fi}[1]$, $W_{Fi}[2]$) is high, switch-current cell 610 (620, 630) is in an "off" state and $I_{610}$ ($I_{620}$, $I_{630}$) is zero. When $W_{Fi}[0]$ ($W_{Fi}[1]$, $W_{Fi}[2]$) is low, switch-current cell 610 (620, 630) is in an "on" state and $I_{610}$ ($I_{620}$, $I_{630}$) is established in accordance with the gate-biasing voltage $V_{B2}$. A speed of DAC 600 is determined by resistor 601 and a parasitic capacitance at node $N_{S2}$. To have a high speed, one can choose a small resistance value for resistor 601.

Although it is shown in FIG. 1 that two varactor arrays (i.e. VA1 and VA2) are used in tuning network 130, this is just an example, but not a limitation. DCO 100 will still work if, for instance, varactor array VA2 is removed while varactor array VA1 remains. However, if VA2 is removed while VA1 remains, the two gain stages GS1 and GS2 will have different loads, and a waveform of the oscillation voltages $V_1$ and $V_2$ will be different from a waveform of the oscillation voltages $V_3$ and $V_4$; this may or may not be an issue, depending on an application of DCO 100.

Upon a start-up, a coarse adjustment process is taken, wherein an oscillation frequency of an oscillation signal of DCO 100 (i.e. one of $V_1$, $V_2$, $V_3$ and $V_4$) is detected and compared with a target value. An oscillation frequency of an oscillation signal can be detected, for instance, using a counter. If the oscillation frequency is higher (lower) than the target value, the coarse control word $W_C$ is decremented (incremented) to decrease (increase) the supply current $I_{sup}$ and consequently lower (raise) the supply voltage $V_{sup}$ and cause the oscillation frequency to fall (rise). The coarse adjustment process is repeated for a plurality of times, and the oscillation frequency is adjusted toward the target value. After that, the coarse control word $W_C$ is frozen, and a fine adjustment process is taken in a closed loop manner, wherein a timing error of the oscillation signal is detected, and the fine control word $W_C$ is adjusted in accordance with the timing error. If DCO 100 is used in a phase lock loop, the timing error is a difference between the timing of the oscillation signal and a timing of a reference clock and can be detected, for instance, using a time-to-digital converter. If DCO 100 is used in a clock-data recovery loop, the timing error of the oscillation signal is a difference between the timing of the oscillation signal and a timing embedded in a data signal and can be detected, for instance, using a binary phase detector. "Phase lock loop," "time-to-digital converter," "clock-data recovery loop," and "binary phase detector" are all well known in the prior art and thus not described in detail here. If the timing error is positive (negative), indicating the timing of the oscillation signal is earlier (later) than expected, the fine control word $W_F$ is incremented (decremented) to lower (raise) a voltage of $V_C[M-1,:0]$ and consequently increase (decrease) a capacitance of tuning network 130 and as a result slow down (speed up) the oscillation signal. The fine control word $W_F$ is thus adjusted to minimize the difference between the timing of the oscillation signal and the timing of the reference clock or the timing embedded in the data signal.

An oscillation frequency of DCO 100 is jointly controlled by both the coarse control word $W_C$ and the fine control word $W_F$. That $W_C$ is said to be a "coarse" control word while $W_F$ is said to be a "fine" control word is stated in a relative sense, i.e. an incremental change in response to $W_C$ is substantially greater than an incremental change in response to $W_F$. By way of example but not limitation: an oscillation frequency of DCO 100 is approximately 10 GHz when $W_C$ is set to minimal (i.e. 0); $W_C$ is a 6-bit word (in binary representation); an incremental change of the oscillation frequency due to an incremental change of $W_C$ is approximately 50 MHz; a total range of tuning by $W_C$ is approximately 3.2 GHz; $W_F$ is a 8-bit word (in binary representation); an incremental change of the oscillation frequency due to an incremental change of $W_F$ is approximately 1 MHz; and a total range of tuning by $W_F$ is approximately 250 MHz. Due to using a combination of a coarse control and a fine control, a wide-range high-resolution tuning is fulfilled. However, when used in a closed loop, $W_C$ is frozen and only $W_F$ is adapted. This allows the tuning circuit pertaining to $W_C$ to be low-noised (due to no high-speed requirement), while the tuning circuit pertaining to $W_F$ to be fast but not contribute too much noise (due to a small tuning range to cover). As a result, DCO 100 can have a high speed, a high resolution, and a low noise at the same time.

That LS DAC 120 is said to be "low-speed" while HS DAC array 140 is said to be "high-speed" is stated in a relative sense, i.e. HS DAC array 140 is substantially faster than LS DAC 120. By way of example but not limitation, a time delay between a change of $W_C$ and a corresponding change of an oscillation frequency of DCO 100 is approximately 10 μs, and a time delay between a change of $W_F$ and a corresponding change of an oscillation frequency of DCO 100 is approximately 1 ns. In other words, HS DAC array 140 is approximately ten thousand times faster than LS DAC 120.

Figure 7:
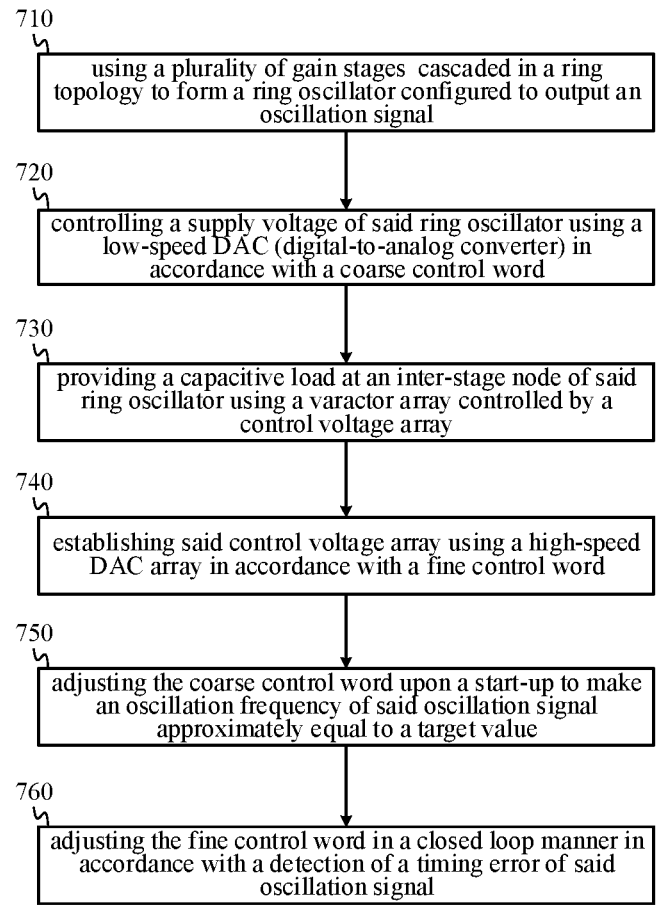
FIG. 7 shows a flow diagram of a method in accordance with an embodiment of the present disclosure.

As illustrated by the flow diagram 700 shown in FIG. 7, a method in accordance with an embodiment of the present disclosure comprises: (step 710) using a plurality of gain stages cascaded in a ring topology to form a ring oscillator configured to output an oscillation signal; (step 720) controlling a supply voltage of said ring oscillator using a low-speed DAC (digital-to-analog converter) in accordance with a coarse control word; (step 730) providing a capacitive load at an inter-stage node of said ring oscillator using a varactor array controlled by a control voltage array; (step 740) establishing said control voltage array using a high-speed DAC array in accordance with a fine control word; (step 750) adjusting the coarse control word upon a start-up to make an oscillation frequency of said oscillation signal approximately equal to a target value; and (step 760) adjusting the fine control word in a closed loop manner in accordance with a detection of a timing error of said oscillation signal.

Those skilled in the art will readily observe that numerous modifications and alterations of the device and method may be made while retaining the teachings of the disclosure.

What is claimed is:

1. A DCO (digitally-controlled oscillator) comprising:
    a ring oscillator having a plurality of gain stages cascaded in a ring topology with a negative feedback to output an oscillation signal at an inter-stage node in accordance with a supply voltage at a supply node;
    a low-speed DAC (digital-to-analog converter) configured to output a supply current to the supply node to establish the supply voltage in accordance with a coarse control word;
    a varactor array configured to provide a capacitive load to said inter-stage node in accordance with a control voltage array; and
    a high-speed DAC array configured to output said control voltage array in accordance with a fine control word,
    wherein the low-speed DAC further comprises:
        a current to voltage conversion circuit configured to convert a summed current into a bias voltage; and
        a low pass filter configured to filter the bias voltage into a filtered bias voltage.

2. The DCO of claim 1, wherein each of said plurality of gain stages comprises a differential pair configured to receive an oscillating voltage from a preceding gain stage and output an oscillating voltage to a succeeding gain stage and a regenerative load configured to present a negative resistance.

3. The DCO of claim 1, wherein the low-speed DAC comprises a current source and a plurality of switched-current cells configured to jointly output the summed current in accordance with the coarse control word.

4. The DCO of claim 3, wherein each of said plurality of switch-current cell comprises a current source and a switch controlled by a respective bit of the coarse control word.

5. The DCO of claim 1, wherein the low-speed DAC further comprises a MOS (metal oxide semiconductor) transistor configured to output the supply current in accordance with the filtered bias voltage.

6. The DCO of claim 5, wherein the MOS transistor is a PMOS (p-channel metal oxide semiconductor) transistor configured in a common-source amplifier topology.

7. The DCO of claim 5, wherein the MOS transistor is a NMOS (n-channel metal oxide semiconductor) transistor configured in a source follower topology.

8. The DCO of claim 1, wherein the varactor array comprises a plurality of varactor pairs and the control voltage array comprises a plurality of control voltages, wherein each varactor pair in said plurality of varactor pairs is controlled by a respective control voltage in said control voltage array.

9. The DCO of claim 8, wherein the high-speed DAC array comprises a decoder configured to decode the fine control word into a plurality of decoded control words, and a plurality of digital-to-analog converters, wherein each digital-to-analog converter in said plurality of digital-toanalog converters is controlled by a respective decoded control word in said plurality of decoded control words.

10. The DCO of claim 1, wherein the coarse control word is adjusted upon a start-up in accordance with a comparison of an oscillation frequency of the oscillation signal with a target value and then frozen.

11. The DCO of claim 10, wherein after the coarse control word is adjusted and frozen the fine control word is adjusted in a closed loop manner in accordance with a detection of a timing error of the oscillation signal.

12. The DCO of claim 11, wherein the timing error of the oscillation signal is a difference between a timing of the oscillation signal and a reference timing provided by either or reference clock or a data signal.

13. A DCO (digitally-controlled oscillator) comprising:
a ring oscillator having a plurality of gain stages cascaded in a ring topology with a negative feedback to output an oscillation signal at an inter-stage node in accordance with a supply voltage at a supply node;
a low-speed DAC (digital-to-analog converter) configured to output a supply current to the supply node to establish the supply voltage in accordance with a coarse control word;
a varactor array configured to provide a capacitive load to said inter-stage node in accordance with a control voltage array; and
a high-speed DAC array configured to output said control voltage array in accordance with a fine control word,
wherein the varactor array comprises a plurality of varactor pairs and the control voltage array comprises a plurality of control voltages, wherein each varactor pair in said plurality of varactor pairs is controlled by a respective control voltage in said control voltage array,
wherein the high-speed DAC array comprises a decoder configured to decode the fine control word into a plurality of decoded control words, and a plurality of digital-to-analog converters, wherein each digital-to-analog converter in said plurality of digital-to-analog converters is controlled by a respective decoded control word in said plurality of decoded control words,
wherein a sum of said plurality of decoded control words is equal to the fine control word.

14. The DCO of claim 13, wherein the decoder decodes the fine control word based on a thermometer code.

15. The DCO of claim 13, wherein the decoder decodes the fine control word based on a binary code.

16. The DCO of claim 13, wherein each digital-to-analog converter in said plurality of digital-to-analog converters comprises: a plurality of switch-current cells configured to output a summed current in accordance with a respective decoded control word in said plurality of decoded control words, and a resistor configured to convert the summed current into a respective control voltage in said control voltage array.

17. The DCO of claim 16, wherein each switch-current cell in said plurality of switch-current cells comprises a current source and a switch controlled by a respective bit of the respective decoded control word.

18. A method comprising:
providing a plurality of gain stages cascaded in a ring topology to form a ring oscillator configured to output an oscillation signal;
controlling a supply voltage of said ring oscillator using a low-speed DAC (digital-to-analog converter) in accordance with a coarse control word, wherein the low-speed DAC operates by:
using a current to voltage conversion circuit to convert the summed current into a bias voltage; and
using a low pass filter configured to the bias voltage into a filtered bias voltage;
providing a capacitive load at an inter-stage node of said ring oscillator using a varactor array controlled by a control voltage array;
establishing said control voltage array using a high-speed DAC array in accordance with a fine control word;
adjusting the coarse control word upon a start-up to make an oscillation frequency of said oscillation signal approximately equal to a target value; and
adjusting the fine control word in a closed loop manner in accordance with a detection of a timing error of said oscillation signal.

* * * * *